(12) United States Patent
Choy et al.

(10) Patent No.: US 9,985,016 B2
(45) Date of Patent: May 29, 2018

(54) CHARGE PUMP CIRCUIT FOR PROVIDING MULTIPLIED VOLTAGE

(71) Applicant: NXP USA, INC., Austin, TX (US)

(72) Inventors: Jon S. Choy, Austin, TX (US); Michael G. Neaves, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/444,355

(22) Filed: Feb. 28, 2017

(65) Prior Publication Data

US 2017/0170163 A1 Jun. 15, 2017

Related U.S. Application Data

(62) Division of application No. 14/849,194, filed on Sep. 9, 2015, now Pat. No. 9,621,033.

(51) Int. Cl.
*H03L 7/06* (2006.01)
*H01L 27/02* (2006.01)
*H01L 27/12* (2006.01)

(52) U.S. Cl.
CPC ...... *H01L 27/0222* (2013.01); *H01L 27/1203* (2013.01)

(58) Field of Classification Search
CPC ... H02M 3/07; H03H 2003/071; H03H 3/073; H03H 2003/075; H03H 2003/077
USPC .......................................... 327/534–537, 589
See application file for complete search history.

(56) References Cited

U.S. PATENT DOCUMENTS

| | | | | |
|---|---|---|---|---|
| 5,622,885 A | * | 4/1997 | Merrill | H01L 27/0218 257/E27.062 |
| 5,874,850 A | | 2/1999 | Pulvirenti et al. | |
| 6,107,864 A | * | 8/2000 | Fukushima | H02M 3/073 327/536 |
| 6,384,398 B1 | * | 5/2002 | Kalnitsky | H01L 27/14609 250/208.1 |
| 6,429,723 B1 | * | 8/2002 | Hastings | H01L 27/0222 327/536 |
| 6,621,325 B2 | * | 9/2003 | Hart | G06F 17/5054 257/E27.067 |
| 6,919,236 B2 | | 7/2005 | Wei et al. | |
| 7,466,190 B2 | | 12/2008 | Lall et al. | |
| 8,461,910 B2 | | 6/2013 | Nadimpalli | |
| 8,963,618 B2 | * | 2/2015 | Keane | H03K 17/6872 327/434 |
| 9,026,063 B2 | | 5/2015 | Labaziewicz et al. | |

FOREIGN PATENT DOCUMENTS

JP 2002299559 A 10/2002

OTHER PUBLICATIONS

Innocent et al, "A linear high voltage charge pump for MEMs applications in 0.18/spl mu/m CMOS technology", Proceedings of the 29th European Solid-State Circuits Conference, Sep. 16-18, 2003, pp. 457-460.

* cited by examiner

*Primary Examiner* — Dinh T Le

(57) ABSTRACT

A charge pump comprises one or more pump stages for providing a negative boosted output voltage. Each of the one or more pump stages comprises a P-channel transistor formed in an isolated P-well and an N-channel transistor coupled in series with the P-channel transistor. Forming the P-channel transistor in the isolated P-well essentially eliminates a raised threshold voltage due to body effect.

20 Claims, 3 Drawing Sheets

CHARGE PUMP CIRCUIT FOR PROVIDING MULTIPLIED VOLTAGE

This application is a divisional application of a U.S. patent application entitled "CHARGE PUMP CIRCUIT FOR PROVIDING MULTIPLIED VOLTAGE", having a serial number of Ser. No. 14/849,194, having a filing date of Sep. 9, 2015, having common inventors, and having a common assignee, all of which is incorporated by reference in its entirety.

BACKGROUND

Field

This disclosure relates generally to circuits, and more specifically, to a charge pump circuit that provides a multiplied voltage.

Related Art

For integrated circuits manufactured at advanced semiconductor processing nodes such as 28 nm (nanometer) feature size and smaller, leakage current between the source and drain terminals of transistors is an increasing problem, especially in very large integrated circuits having a large number of transistors. Metal oxide semiconductor (MOS) transistors are typically characterized as being four terminal devices having a gate, drain, source, and body terminals. One way to reduce leakage current in a MOS transistor is to independently bias the body terminals of the transistors with a reverse body bias instead of coupling the substrate terminals to the corresponding power supply terminals. A charge pump is generally used to generate the independent bias voltage. However, the charge pump can have very poor efficiency and limited voltage range being greatly impacted by the body effect of the pump transistors. As such, there is a need to not only improve the efficiency of the charge pump, but also to extend the voltage range of the charge pump.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a charge pump circuit that efficiently provides negative voltages and broader voltage ranges. The charge pump circuit includes one or more pump stages coupled in series. Each pump stage includes one or more phase circuits, each phase circuit including a five-terminal P-channel transistor formed in an isolated P-well and a five-terminal N-channel transistor coupled in series with the P-channel transistor. The charge pump circuit may be coupled to body terminals of transistors of an integrated circuit as body biasing for adjusting the threshold of the transistors, instead of coupling the body terminals to respective power supply and ground. For example, the charge pump circuit may provide a body biasing voltage for N-channel transistors by providing a voltage lower than ground to the P-well to reduce transistor leakage current. In some embodiments, the charge pump circuit may provide a higher than ground voltage to the P-well to increase transistor performance.

Figure 1:
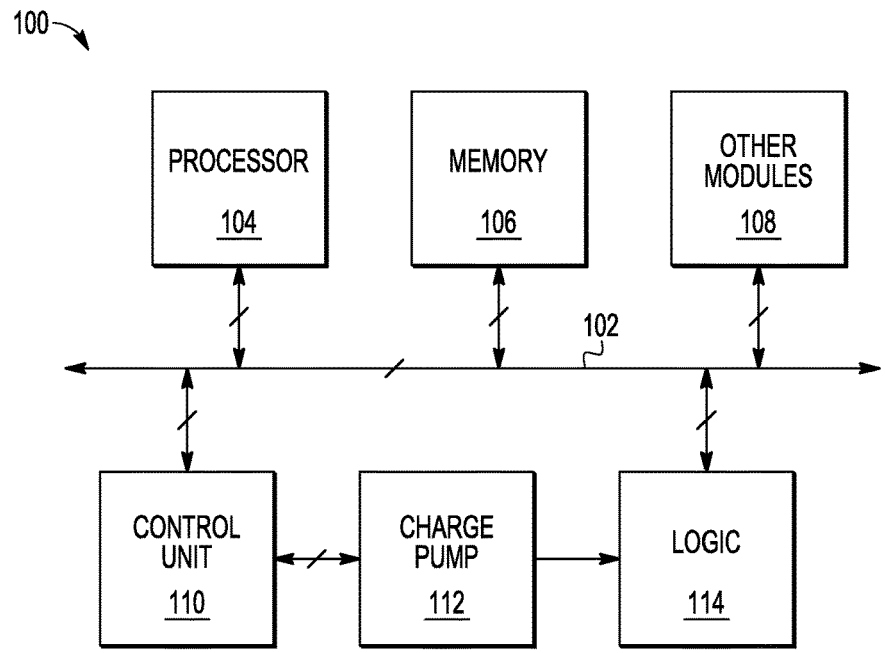
FIG. 1 illustrates, in block diagram form, an integrated circuit in accordance with an embodiment of the present disclosure

FIG. 1 illustrates, in block diagram form, integrated circuit 100 in accordance with an embodiment of the present disclosure. Integrated circuit 100 may be implemented using a CMOS process having P-channel transistors in a P-Well and N-channel transistors in a P-Well. In one embodiment, integrated circuit 100 is a system-on-a-chip (SoC). Integrated circuit 100 includes a system bus 102, processor 104, memory 106, other modules 108, control unit 110, charge pump 112, and logic 114. Processor 104, memory 106, other modules 108, control unit 110, and logic 114 are all bi-directionally connected to the system bus 102. System bus 102 can be any type of bus for communicating any type of information such as data, address, or instructions. Processor 104 may be any type of processor such as a microprocessor (MPU), microcontroller (MCU), digital signal processor (DSP), or other type of processing core. Integrated circuit 100 may include multiple processors like processor 104. Memory 106 may be any type of volatile or non-volatile memory, such as static random access memory (SRAM), dynamic random access memory (DRAM), flash, etc. Memory 106 may also be connected directly to processor 104. Control unit 110 has outputs for providing control signals including clock signals, for example, to charge pump 112. Charge pump 112 has one or more outputs for providing one or more body bias voltages for transistors in logic 114. Charge pump 112 may be characterized as a negative charge pump having the output voltage being negative relative to a ground supply voltage.

Logic 114 includes circuits for providing specific functionality to integrated circuit 100. Logic 114 may comprise logic gates such as AND, OR, NAND, NOR, exclusive OR, exclusive NOR, inverters, complex logic gates, and the like. Such logic gates may be arranged to form functional blocks such as processor, timer, counter, communication, interface, and the like for example. Logic 114 may occupy a large area of an integrated circuit and there may be more than one charge pump 112 to supply the corresponding body area. Logic 114 may also be referred to as a sea-of-gates (SoG). Other modules 108 may include any other module such as analog-to-digital converter, digital-to-analog converter, PLL, I/O, and the like for example.

Figure 2:
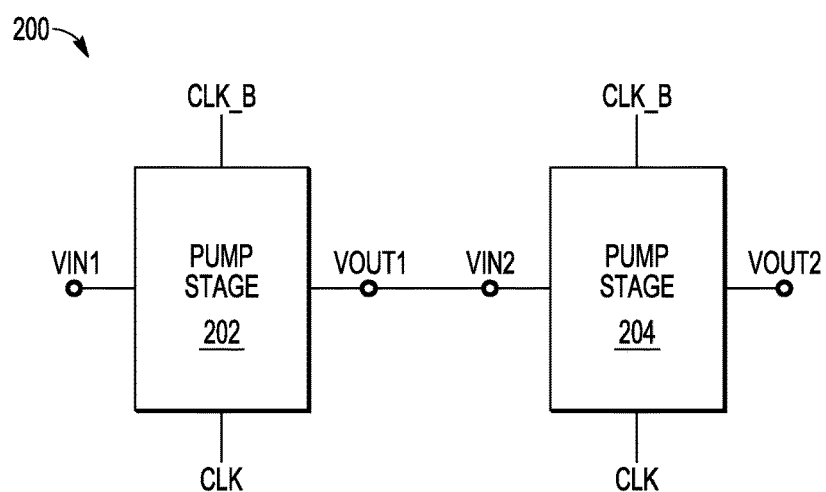
FIG. 2 illustrates, in block diagram form, pump stages coupled in series in accordance with an embodiment of the present disclosure.

FIG. 2 illustrates, in block diagram form, a pump unit 200 of the charge pump 112 in accordance with an embodiment of the present disclosure. Pump unit 200 includes a first pump stage 202 coupled in series to a second pump stage 204. In some embodiments, pump unit 200 may include one pump stage. In some embodiments, pump unit 200 may include more than two pump stages coupled in series. Each pump stage includes inputs for a clock CLK, a complementary clock CLK_B, an input (VIN1 and VIN2) to receive an input voltage, and an output (VOUT1 and VOUT2) for providing a pumped voltage. The clock signal generally toggles between ground and VDD voltages. In some embodiments, the VDD voltage is the same voltage provided to operating circuitry on the integrated circuit 100. In the series coupled pump stages of pump unit 200, the pumped voltage at first pump stage 202 output VOUT1 may be generated by subtracting a portion of the clock voltage at the CLK input to the input voltage received at the VIN1 input. The pumped voltage may be a lower voltage or a higher voltage relative to the input voltage. The output voltage at VOUT1 of first pump stage 202 is provided as the input voltage at VIN2 of the second pump stage 204. Accordingly, the output voltage at VOUT2 of the second pump stage 204 may be generated by subtracting a portion of the clock voltage at the CLK input to the received output voltage of first pump stage 202. For example, the input voltage received at the VIN1 input of the first pump stage 202 may ground or 0 volts and the pumped output voltage provided at the VOUT1 output of the first pump stage 202 may be 0 volts minus 1.5 volts when VDD of the clock signal is 1.5 volts. In the second stage 204, −1.5 volts is received at the VIN2 input. The pumped output voltage provided at the VOUT2 output of the second pump stage 204 may be −3.0 volts (−1.5 volts minus 1.5 volts). To smooth the output voltage signal, a capacitor (not shown) may be coupled to VOUT2 of last pump stage 204.

Figure 3:
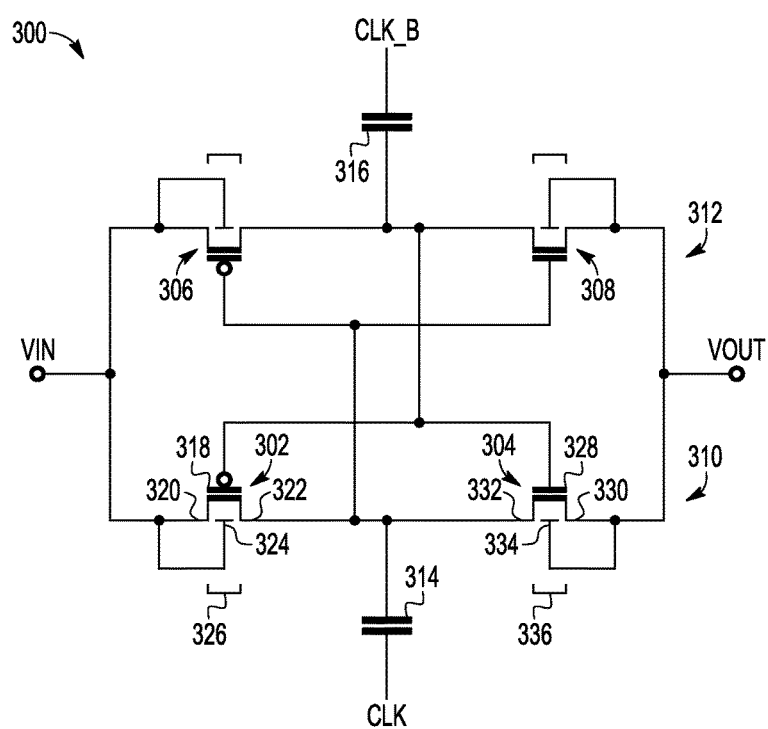
FIG. 3 illustrates, in schematic diagram form, a dual-phase pump stage in accordance with an embodiment of the present disclosure.

FIG. 3 illustrates, in schematic diagram form, a dual-phase pump stage 300 of the pump unit 200 in accordance with an embodiment of the present disclosure. The dual-phase pump stage 300 includes input voltage terminal VIN, output voltage terminal VOUT, first clock input terminal CLK, second clock input terminal CLK_B, first phase circuit 310, and second phase circuit 312.

The first phase circuit 310 of the dual-phase pump stage 300 includes a five-terminal P-channel transistor 302 and a five-terminal N-channel transistor 304 coupled in series between VIN and VOUT, and capacitor 314. First current electrode 320 of P-channel transistor 302 is coupled to body electrode 324 and to VIN. Body isolation electrode 326 is coupled to a voltage supply. In this embodiment, the voltage supply provides a positive voltage such as an operating voltage of circuitry, VDD, for example. The voltage supply may be provided on-chip using a regulator or the like, or may be provided from off-chip. Second current electrode 322 of P-channel transistor 302 is coupled to first current electrode 332 of N-channel transistor 304. Control electrode 318 of P-channel transistor 302 is coupled to control electrode 328 of N-channel transistor 304. A second current electrode 330 of N-channel transistor 304 is coupled to body terminal 334 of N-channel transistor 304 and VOUT. A first terminal of capacitor 314 is coupled to the CLK input terminal to receive a clock signal and a second terminal of capacitor 314 is coupled to the second current electrode 322 of P-channel transistor 302, the first current electrode 332 of N-channel transistor 304, and control electrodes of transistors 306 and 308.

The second phase circuit 312 of the dual-phase pump stage 300 includes five-terminal P-channel transistor 306 and five-terminal N-channel transistor 308 coupled in series between VIN and VOUT, and capacitor 316. A first current electrode of P-channel transistor 306 is coupled to a body electrode of P-channel transistor 306 and to VIN. A second current electrode of P-channel transistor 306 is coupled to a first current electrode of N-channel transistor 308. Control electrodes of P-channel transistor 306 and N-channel transistor 308 are coupled to the second current electrode 322, first current electrode 332, and second terminal of capacitor 314. A second current electrode of N-channel transistor 308 is coupled to a body terminal of N-channel transistor 308 and VOUT. A first terminal of capacitor 316 is coupled to the CLK_B input terminal to receive a complementary clock signal and a second terminal of capacitor 316 is coupled to the second current electrode of P-channel transistor 306, the first current electrode of N-channel transistor 308, and control electrodes of transistors 302 and 304. The complimentary clock signal is a complement or inverse of the clock signal. In some embodiments, the clock and complimentary clock signals are non-overlapping. Capacitors 314 and 316 may be any capacitive elements and may be formed with any suitable materials and structures available in a given process technology such as metal-oxide-semiconductor (MOS) capacitors, metal-insulator-metal (MIM) capacitors, poly-silicon-insulator-polysilicon (PIP) capacitors, deep trench capacitors, and the like, for example.

In operation, each of the phase circuits 310 and 312 of the dual-phase pump stage 300 uses charge alternatingly stored on capacitors 314 and 316 to multiply an input voltage. For example, considering the first phase circuit 310, the clock signal provided to the CLK input of capacitor 314 pre-charges capacitor 314 during a first phase of the clock signal. During a second phase of the clock signal, the output voltage at the VOUT output is a multiplied voltage of the input voltage at VIN input, based on the amount of charge stored during the first phase. Considering the second phase circuit, an inverse or complement of the clock signal provided to the CLK_B input of capacitor 316 pre-charges capacitor 314 during the second phase of the clock signal. And during the first phase of the clock signal, the output voltage at the VOUT output is a multiplied voltage of the input voltage at VIN input, based on the amount of charge stored during the second phase. With the first phase circuit 310 and the second phase circuit 312 operating on opposite clock phases, charge on each capacitor 314 and 316 contributes to the resulting multiplied output voltage at VOUT.

The five-terminal P-channel transistors 302 and 306 of dual-phase pump stage 300 allow approximately equal voltages to be applied to both first current electrode and body electrode (source terminal and the body terminal respectively) when the voltages are substantially more negative than a voltage applied to the P-type substrate (PSUB). For example, the source terminals and body terminals of P-channel transistors 302 and 306 may be approximately 1.5 volts more negative than a ground voltage applied to the PSUB. P-channel transistors 302 and 306 having approximately equal voltages applied to both the source terminals and the drain terminals increases conductivity during a conductive state more so than a P-channel transistor in which a body terminal is at a higher voltage than a source terminal. Higher conductivity during the conductive state allows more efficient charge transfers in dual-phase pump stages 300 of charge pump 112.

Figure 4:
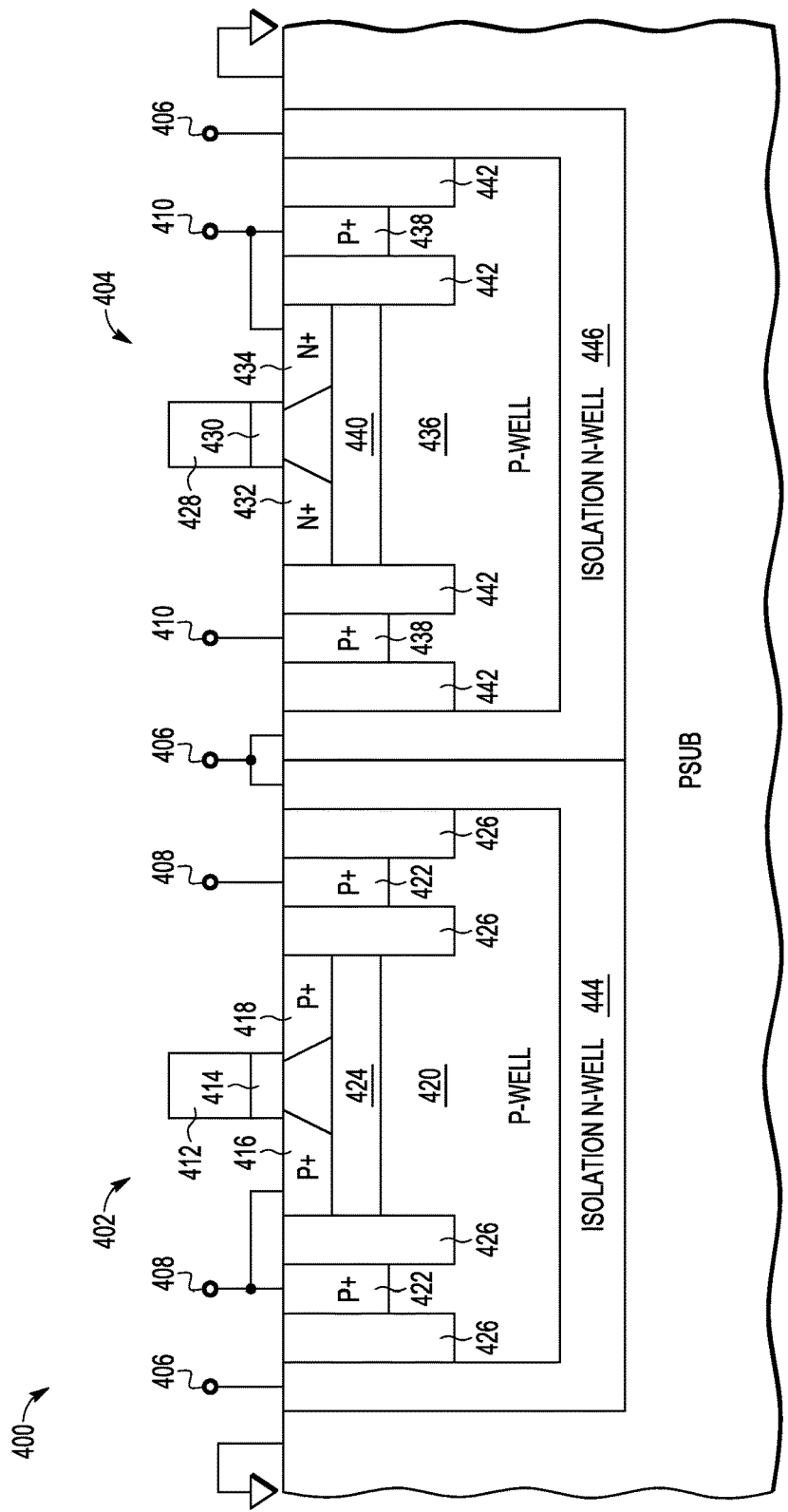
FIG. 4 illustrates, in a simplified cross-sectional view, transistors of one phase of the dual-phase pump stage in accordance with an embodiment of the present disclosure.

FIG. 4 illustrates, in a simplified cross-sectional view, five-terminal transistors of one phase 400 of a dual-phase pump stage formed on a silicon-on-insulator (SOI) substrate according to an embodiment of the present disclosure. The transistors of one phase 400 include five-terminal P-channel transistor 402 and five-terminal N-channel transistor 404 and correspond to five-terminal transistors 302 and 304 of the first phase circuit 310 described above. P-channel transistor 402 is formed on a buried oxide (BOX) layer 424 over an isolated P-well 420 and includes a gate electrode 412 formed on a gate dielectric 414. Gate electrode 412 typically includes a polysilicon material but may include any suitable conductive material. Gate dielectric 414 can be formed of any suitable dielectric material such as a grown or deposited oxide material. P-channel transistor 402 includes a first current electrode 416 and a second current electrode 418 formed on opposing sides of gate electrode 412, forming a channel below the gate dielectric 414. P-channel transistor 402 may include other aspects not shown in FIG. 4 such as a gate electrode contact, source/drain electrode contacts, source/drain extension implants and/or sidewall spacers, and the like. First current electrode 416 of P-channel transistor 402 is coupled to the isolated P-well 420 at isolated P-well body electrode 408. P+ well ties 422 provide connectivity between isolated P-well body electrodes 408 and isolated P-well 420. Isolated P-well 420 of P-channel transistor 402 is formed within a surrounding isolation N-well 444. The surrounding isolation N-well 444 is formed as a deep N-well or buried N-well implant with formed N-type doped or implanted wall portions surrounding the isolated P-well 420. Isolation N-well 444 isolates P-well 420 from the P-type substrate PSUB. Isolation N-well electrode 406 provides coupling to the isolation N-well 444. Shallow trench isolation (STI) structures 426 are formed between the first and second current electrodes 416 and 418 and P+ well ties 422, and between P+ well ties 422 and isolation N-well 444. STI 426 can be formed of any suitable dielectric material such as a deposited oxide material, for example. The gate electrode 412 of P-channel transistor 402 may be referred to as a gate terminal, first and second current electrodes 416 and 418 as source and drain terminals, isolated P-well body electrode 408 as an isolated P-well body terminal, and isolation N-well electrode 406 as an isolation N-well terminal, and as such, represent five terminals of P-channel transistor 402.

N-channel transistor 404 is formed on a buried oxide (BOX) layer 440 over an isolated P-well 436 and includes a gate electrode 428 formed on a gate dielectric 430. Gate electrode 430 typically includes a polysilicon material but may include any suitable conductive material. Gate dielectric 430 can be any suitable dielectric material such as a grown or deposited oxide material. N-channel transistor 404 includes a first current electrode 432 and a second current electrode 434 formed on opposing sides of gate electrode 428, forming a channel below the gate dielectric 430. N-channel transistor 404 may include other aspects not shown in FIG. 4 such as a gate electrode contact, source/drain electrode contacts, source/drain extension implants and/or sidewall spacers, and the like. Second current electrode 434 of N-channel transistor 404 is coupled to the isolated P-well 436 at isolated P-well body electrode 410. P+ well ties 438 provide connectivity between isolated P-well body electrodes 410 and isolated P-well 436. Isolated P-well 436 of N-channel transistor 404 is formed within a surrounding isolation N-well 446. The surrounding isolation N-well 446 is formed as a deep N-well or buried N-well implant with formed N-type doped or implanted wall portions surrounding the isolated P-well 436. Isolation N-well 446 isolates P-well 436 from the P-type substrate PSUB. Isolation N-well terminals 406 provide coupling to the isolation N-well 446. Shallow trench isolation (STI) structures 442 are formed between the first and second current electrodes 432 and 434 and P+ well ties 438, and between P+ well ties 438 and isolation N-well 446. STI 442 can be formed of any suitable dielectric material such as a deposited oxide material, for example. The gate electrode 428, first and second current electrodes 432 and 434, isolated P-well body electrode 410, and isolation N-well electrode 406 can be characterized as five terminals of N-channel transistor 404. The gate electrode 428 of N-channel transistor 404 may be referred to as a gate terminal, first and second current electrodes 432 and 434 as drain and source terminals, isolated P-well body electrode 410 as an isolated P-well body terminal, and isolation N-well electrode 406 as an isolation N-well terminal, and as such, represent five terminals of N-channel transistor 404.

Still referring to FIG. 4, isolation N-well 444 and isolation N-well 446 are coupled to a common voltage supply via isolation N-well electrodes 406. In some embodiments, isolation N-well 444 and isolation N-well 446 may be each coupled to different voltage supplies. Five-terminal transistors 402 and 404 are formed in a P-type substrate (PSUB). The PSUB may be lightly doped (P−) or heavily doped (P+). The PSUB is typically coupled to ground through substrate ties (not shown). In some embodiments, the PSUB may be coupled to a voltage supply other than ground.

Generally, there is provided, a charge pump circuit including: a P-channel transistor formed in an isolated P-well; and an N-channel transistor coupled in series with the P-channel transistor. The charge pump may further include a capacitive element having a first terminal coupled to the P-channel transistor and to the N-channel transistor, and a second terminal coupled to receive a clock signal. The isolated P-well may be formed within an isolation N-well. The P-channel transistor and the N-channel transistor may be part of one pump stage of a plurality of pump stages. The charge pump may provide a negative output voltage. The charge pump may be implemented as part of a silicon-on-insulator (SOI) integrated circuit. The P-channel transistor and the N-channel transistor may be part of a first phase pump stage, and the first phase pump stage and a second phase pump stage may be coupled together to form one of a plurality of pump stages. The charge pump may further include: a first capacitive element having a first terminal coupled to the first phase pump stage, and a second terminal for receiving a first clock signal; and a second capacitive element having a second terminal coupled to the second phase pump stage, and a second terminal for receiving a second clock signal. The charge pump may include a plurality of pump stages coupled in series, wherein an output of a previous pump stage may be coupled to an input of a next pump stage, and wherein the isolated P-well may be coupled to the output of the previous pump stage.

In another embodiment, there is provided, a negative charge pump circuit including: a first P-channel transistor having a gate, a drain, and a P-well body terminal and a source coupled together to receive an input voltage; an first N-channel transistor having a drain coupled to the drain of the first P-channel transistor, a gate coupled to the gate of the first P-channel transistor, and a source for providing an output voltage; and a first capacitive element having a first terminal coupled to the drains of the first P-channel transistor and the first N-channel transistor, and a second terminal for receiving a first clock signal. The P-well body terminal may be coupled to a P-well formed within an isolation N-well. The negative charge pump circuit may further include: a second P-channel transistor having a gate, a drain, and a P-well body terminal and a source coupled together and to the source of the first P-channel transistor to receive the input voltage; a second N-channel transistor having a drain coupled to the drain of the second P-channel transistor, a gate coupled to the gate of the second P-channel transistor, and a source coupled to the source of the first N-channel transistor for providing the output voltage; and a second capacitive element having a first terminal coupled to the drains of the second P-channel transistor and the second N-channel transistor, and a second terminal for receiving a second clock signal. The first and second N-channel transistors each may further include a P-well body terminal coupled to a P-well formed within an isolation N-well. The negative charge pump may be formed on a silicon-oninsulator (SOI) integrated circuit. The output voltage is for biasing body terminals for transistors on the integrated circuit.

In yet another embodiment, there is provided, a charge pump circuit including a plurality of pump stages, a pump stage of the plurality of pump stages includes: a first P-channel transistor having a gate, a drain, and a P-well body terminal and a source coupled together to receive an input voltage; a first N-channel transistor having a drain coupled to the drain of the first P-channel transistor, a gate coupled to the gate of the first P-channel transistor, and a source for providing an output voltage; a first capacitive element having a first terminal coupled to the drains of the first P-channel transistor and the first N-channel transistor, and a second terminal for receiving a first clock signal; a second P-channel transistor having a gate, a drain, and a P-well body terminal and a source coupled together and to the source of the first P-channel transistor to receive the input voltage; a second N-channel transistor having a drain coupled to the drain of the second P-channel transistor, a gate coupled to the gate of the second P-channel transistor, and a source coupled to the source of the first N-channel transistor for providing the output voltage; and a second capacitive element having a first terminal coupled to the drains of the second P-channel transistor and the second N-channel transistor, and a second terminal for receiving a second clock signal. The first P-channel transistor, the first N-channel transistor and the first capacitive element may include a first phase of a pump stage and the second P-channel transistor, second N-channel transistor, and second capacitive element may include a second phase of the pump stage, wherein when one of the first or second phase is being pre-charged, the other of the first or second phase may be providing the output voltage. The first and second N-channel transistors each may further include a P-well body terminal coupled to a P-well formed within an isolation N-well. The charge pump may be formed on a silicon-on-insulator (SOI) integrated circuit. The output voltage may be for biasing body terminals for transistors on the integrated circuit.

By now it should be appreciated that there has been provided, a charge pump circuit that more efficiently provides negative voltages and broader voltage ranges. The charge pump circuit includes one or more pump stages coupled in series. Each pump stage includes one or more phase circuits, each phase circuit including a five-terminal P-channel transistor formed in an isolated P-well and a five-terminal N-channel transistor coupled in series with the P-channel transistor. The charge pump circuit may be coupled to body terminals of transistors of an integrated circuit as body biasing for adjusting the threshold of the transistors, instead of coupling the body terminals to respective power supply and ground.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A negative charge pump circuit comprising:
   a first P-channel transistor having a gate, a drain, and a P-well body terminal and a source coupled together to receive an input voltage, the P-well body terminal coupled to a P-well formed within an isolation N-well;
   a first N-channel transistor having a drain coupled to the drain of the first P-channel transistor, a gate coupled to the gate of the first P-channel transistor, and a source for providing an output voltage;
   a first capacitive element having a first terminal coupled to the drains of the first P-channel transistor and the first N-channel transistor, and a second terminal for receiving a first clock signal;
   a second P-channel transistor having a gate, a drain, and a P-well body terminal and a source coupled together and to the source of the first P-channel transistor to receive the input voltage;
   a second N-channel transistor having a drain coupled to the drain of the second P-channel transistor, a gate coupled to the gate of the second P-channel transistor, and a source coupled to the source of the first N-channel transistor for providing the output voltage; and
   a second capacitive element having a first terminal coupled to the drains of the second P-channel transistor and the second N-channel transistor, and a second terminal for receiving a second clock signal;
   wherein the first and second N-channel transistors each further comprise a P-well body terminal coupled to a P-well formed within an isolation N-well.

2. The negative charge pump circuit of claim 1, wherein the negative charge pump is formed on a silicon-on-insulator (SOI) integrated circuit.

3. The negative charge pump circuit of claim 2, wherein the output voltage is for biasing body terminals for transistors on the integrated circuit.

4. The negative charge pump of claim 1, wherein the first P-channel transistor, the first N-channel transistor and the first capacitive element form a first phase of a pump stage and the second P-channel transistor, second N-channel transistor, and second capacitive element form a second phase of the pump stage, and wherein the pump stage is configured such that when one of the first or second phase is being pre-charged, the other of the first or second phase is providing the output voltage.

5. The negative charge pump of claim 1, wherein the first and second clock signals are complimentary non-overlapping clock signals.

6. The negative charge pump of claim 1, wherein the negative charge pump provides a negative output voltage.

7. The negative charge pump of claim 1, wherein the isolation N-well is formed in a P-type substrate.

8. A charge pump circuit comprising a plurality of pump stages, a pump stage of the plurality of pump stages comprising:
   a first P-channel transistor having a gate, a drain, and a P-well body terminal and a source coupled together to receive an input voltage;
   a first N-channel transistor having a drain coupled to the drain of the first P-channel transistor, a gate coupled to the gate of the first P-channel transistor, a source for providing an output voltage, and a P-well body terminal coupled to a P-well formed within an isolation N-well;
   a first capacitive element having a first terminal coupled to the drains of the first P-channel transistor and the first N-channel transistor, and a second terminal for receiving a first clock signal;
   a second P-channel transistor having a gate, a drain, and a P-well body terminal and a source coupled together and to the source of the first P-channel transistor to receive the input voltage;
   a second N-channel transistor having a drain coupled to the drain of the second P-channel transistor, a gate coupled to the gate of the second P-channel transistor, a source coupled to the source of the first N-channel transistor for providing the output voltage, and a P-well body terminal coupled to a P-well formed within an isolation N-well; and
   a second capacitive element having a first terminal coupled to the drains of the second P-channel transistor and the second N-channel transistor, and a second terminal for receiving a second clock signal.

9. The charge pump circuit of claim 8, wherein the first P-channel transistor, the first N-channel transistor and the first capacitive element comprise a first phase of a pump stage and the second P-channel transistor, second N-channel transistor, and second capacitive element comprise a second phase of the pump stage, wherein when one of the first or second phase is being pre-charged, the other of the first or second phase is providing the output voltage.

10. The charge pump circuit of claim 8, wherein the charge pump is formed on a silicon-on-insulator (SOI) integrated circuit.

11. The charge pump circuit of claim 8, wherein the output voltage is for biasing body terminals for transistors on the integrated circuit.

12. A negative charge pump circuit comprising:
   a first phase pump stage formed on a silicon-on-insulator (SOI) integrated circuit including:
      a first P-channel transistor formed over an isolated P-well formed within an isolation N-well, the first P-channel transistor having a gate, a drain, and an isolated P-well body terminal and a source coupled together to receive an input voltage;
      a first N-channel transistor having a drain coupled to the drain of the first P-channel transistor, a gate coupled to the gate of the first P-channel transistor, and a source for providing an output voltage;
      a first capacitive element having a first terminal coupled to the drains of the first P-channel transistor and the first N-channel transistor, and a second terminal for receiving a first clock signal;

a second phase pump stage formed on the SOI integrated circuit including:

a second P-channel transistor having a gate, a drain, and a P-well body terminal and a source coupled together and to the source of the first P-channel transistor to receive the input voltage;

a second N-channel transistor having a drain coupled to the drain of the second P-channel transistor, a gate coupled to the gate of the second P-channel transistor, and a source coupled to the source of the first N-channel transistor for providing the output voltage; and a second capacitive element having a first terminal coupled to the drains of the second P-channel transistor and the second N-channel transistor, and a second terminal for receiving a second clock signal;

wherein the first and second N-channel transistors each further comprise a P-well body terminal coupled to a P-well formed within an isolation N-well.

13. The negative charge pump circuit of claim 12, wherein the first phase pump stage and a second phase pump stage are coupled together to form one of a plurality of pump stages.

14. The negative charge pump of claim 12, wherein the first and second clock signals are complimentary non-overlapping clock signals.

15. The negative charge pump of claim 12, wherein the second P-channel transistor is formed over an isolated P-well, the isolated P-well coupled to the P-well body terminal.

16. The negative charge pump of claim 12, wherein the negative charge pump provides a negative output voltage.

17. The negative charge pump of claim 12, wherein the output voltage is for biasing body terminals of transistors on the SOI integrated circuit.

18. The negative charge pump of claim 12, wherein the isolation N-well is formed in a P-type substrate.

19. The negative charge pump of claim 12, wherein the first P-channel transistor, the first N-channel transistor and the first capacitive element form a first phase of a first pump stage and the second P-channel transistor, second N-channel transistor, and second capacitive element form a second phase of the first pump stage, and wherein the first pump stage is configured such that when one of the first or second phase is being pre-charged, the other of the first or second phase is providing the output voltage.

20. The negative charge pump of claim 12, further comprising a second pump stage coupled in series with the first pump stage, the second pump stage comprising a third P-channel transistor formed over a second isolated P-well, the second isolated P-well coupled to the output of the first pump stage.

* * * * *